United States Patent
Minakuchi et al.

(10) Patent No.: US 11,838,014 B1
(45) Date of Patent: Dec. 5, 2023

(54) SEMICONDUCTOR DEVICE HAVING VOLTAGE GENERATOR GENERATING WELL POTENTIAL

(71) Applicant: MICRON TECHNOLOGY, INC., Boise, ID (US)

(72) Inventors: Keiichiro Minakuchi, Kanagawa (JP); Yuhei Takahashi, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/815,922

(22) Filed: Jul. 28, 2022

(51) Int. Cl.
*G05F 3/02* (2006.01)
*H03K 3/00* (2006.01)
*H03K 17/687* (2006.01)
*G11C 17/08* (2006.01)
*H01L 29/10* (2006.01)

(52) U.S. Cl.
CPC .......... *H03K 17/687* (2013.01); *G11C 17/08* (2013.01); *H01L 29/1083* (2013.01)

(58) Field of Classification Search
None
See application file for complete search history.

(56) References Cited

U.S. PATENT DOCUMENTS

| | | | |
|---|---|---|---|
| 6,753,719 B2 * | 6/2004 | Bhagavatheeswaran | H02M 3/07 327/534 |
| 7,565,259 B2 * | 7/2009 | Sheng | G01K 7/42 702/132 |
| 8,018,780 B2 * | 9/2011 | Houston | G11C 11/413 365/185.27 |
| 8,225,123 B2 * | 7/2012 | Gupta | G06F 1/26 713/323 |
| 8,988,135 B2 * | 3/2015 | Kim | G05F 3/02 327/513 |
| 9,390,786 B2 * | 7/2016 | Lecocq | G11C 11/412 |
| 9,571,104 B1 * | 2/2017 | Menezes | H03K 19/17772 |
| 9,659,933 B2 * | 5/2017 | Rana | H01L 27/092 |
| 10,120,967 B2 * | 11/2018 | Zangi | G01R 31/2621 |
| 11,551,729 B2 * | 1/2023 | Kim | G11C 11/4091 |

* cited by examiner

*Primary Examiner* — Kenneth B Wells
(74) *Attorney, Agent, or Firm* — Dorsey & Whitney LLP

(57) ABSTRACT

An apparatus that includes a MOS transistor arranged in a well region supplied with a well potential, a temperature sensor configured to generate a control code indicating an ambient temperature, and a voltage generator configured to perform a control operation controlling a level of the well potential responsive to the control code in a first condition and perform a second control operation controlling a level of the well potential regardless of the control code in a second condition.

20 Claims, 8 Drawing Sheets

| TS2<2:0> | | | Description | Resistance |
| --- | --- | --- | --- | --- |
| 0 | 0 | 0 | Disable | Rs+7R |
| 0 | 0 | 1 | 25°C or higher | Rs+6R |
| 0 | 1 | 0 | 45°C or higher | Rs+5R |
| 0 | 1 | 1 | 60°C or higher | Rs+4R |
| 1 | 0 | 0 | 80°C or higher | Rs+3R |
| 1 | 0 | 1 | 90°C or higher | Rs+2R |
| 1 | 1 | 0 | 100°C or higher | Rs+R |
| 1 | 1 | 1 | 110°C or higher | Rs |

FIG.3B

SEMICONDUCTOR DEVICE HAVING VOLTAGE GENERATOR GENERATING WELL POTENTIAL

BACKGROUND

In a semiconductor device, an n-channel MOS transistor is formed in a p-type well and a p-channel MOS transistor is formed in an n-type well. An appropriate well potential is respectively applied to the p-type well and the n-type well. Since the off leakage current of each transistor changes according to an ambient temperature, adjusting the well potential in accordance with the ambient temperature can reduce the off leakage current.

BRIEF DESCRIPTION OF THE DRAWINGS

FIG. 3B is a table showing a relation between a control code and a resistance value;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
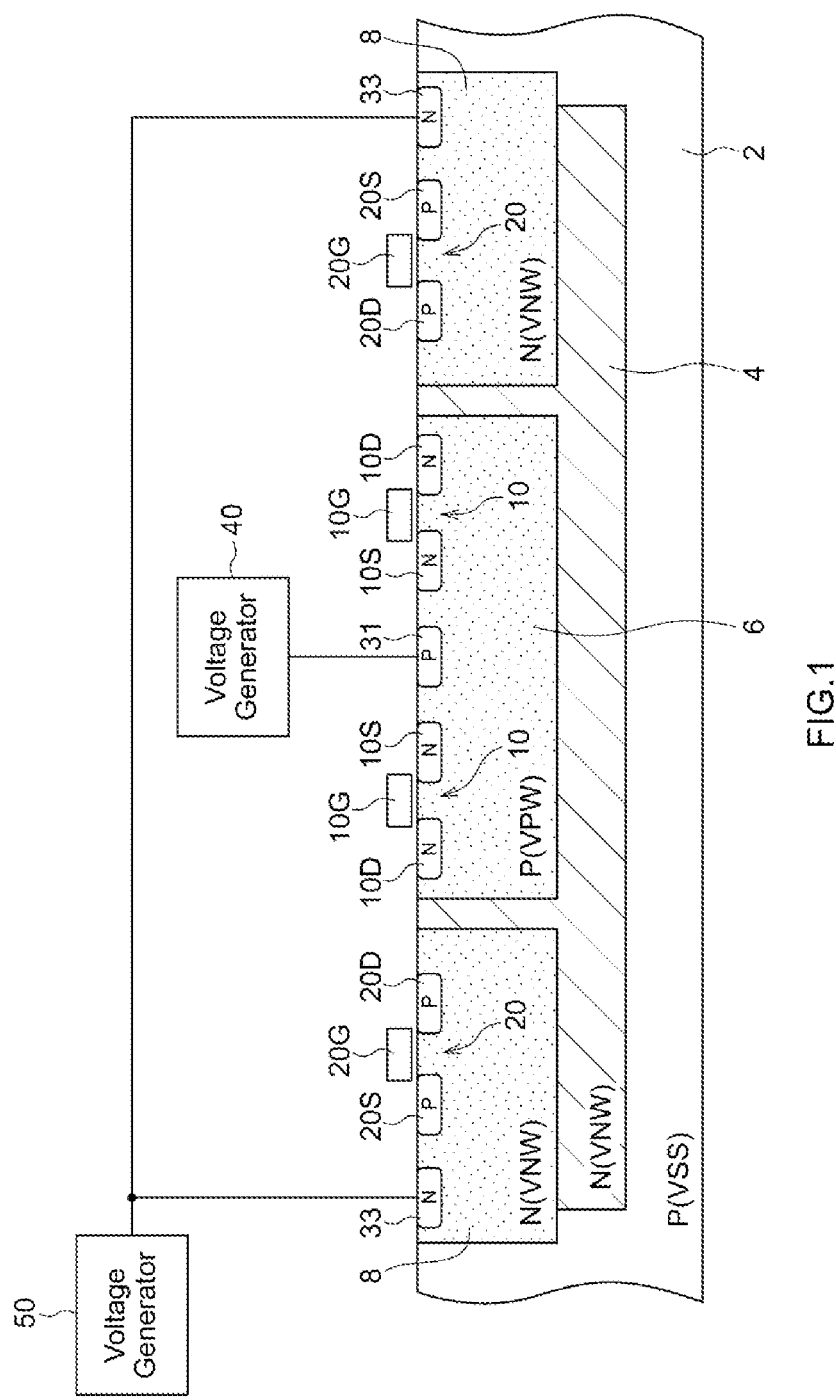
FIG. 1 is a schematic sectional view for explaining a device configuration of a semiconductor device according to the present disclosure.

FIG. 1 is a schematic sectional view for explaining a device configuration of a semiconductor device according to the present disclosure. As shown in FIG. 1, a deep n-well region 4 is formed on a semiconductor substrate 2 composed of p-type silicon. In the deep n-well region 4, a p-well region 6 and n-well regions 8 are formed. The p-well region 6 is a region in which n-channel MOS transistors 10 are formed. A well potential VPW is supplied from a power supply circuit 40 to the p-well region 6 via well contact diffusion region 31. The well contact diffusion region 31 include a p-type diffusion layer higher in dopant concentration than the p-well region 6. The n-well regions 8 are regions in which p-channel MOS transistors 20 are formed. A well potential VNW is supplied from a power supply circuit 50 to the n-well regions 8 via well contact diffusion regions 33, respectively. The well contact diffusion regions 33 each include an n-type diffusion layer higher in dopant concentration than the n-well regions 8. A ground potential VSS is applied to the semiconductor substrate 2. The n-channel MOS transistors 10 each include a source diffusion region 10S and a drain diffusion region 10D which are of the n-type, and a gate electrode 10G covering a channel region between the source diffusion region 10S and the drain diffusion region 10D. The p-channel MOS transistors 20 each include a source diffusion region 20S and a drain diffusion region 20D which are of the p-type, and a gate electrode 20G covering a channel region between the source diffusion region 20S and the drain diffusion region 20D.

Figure 2A:
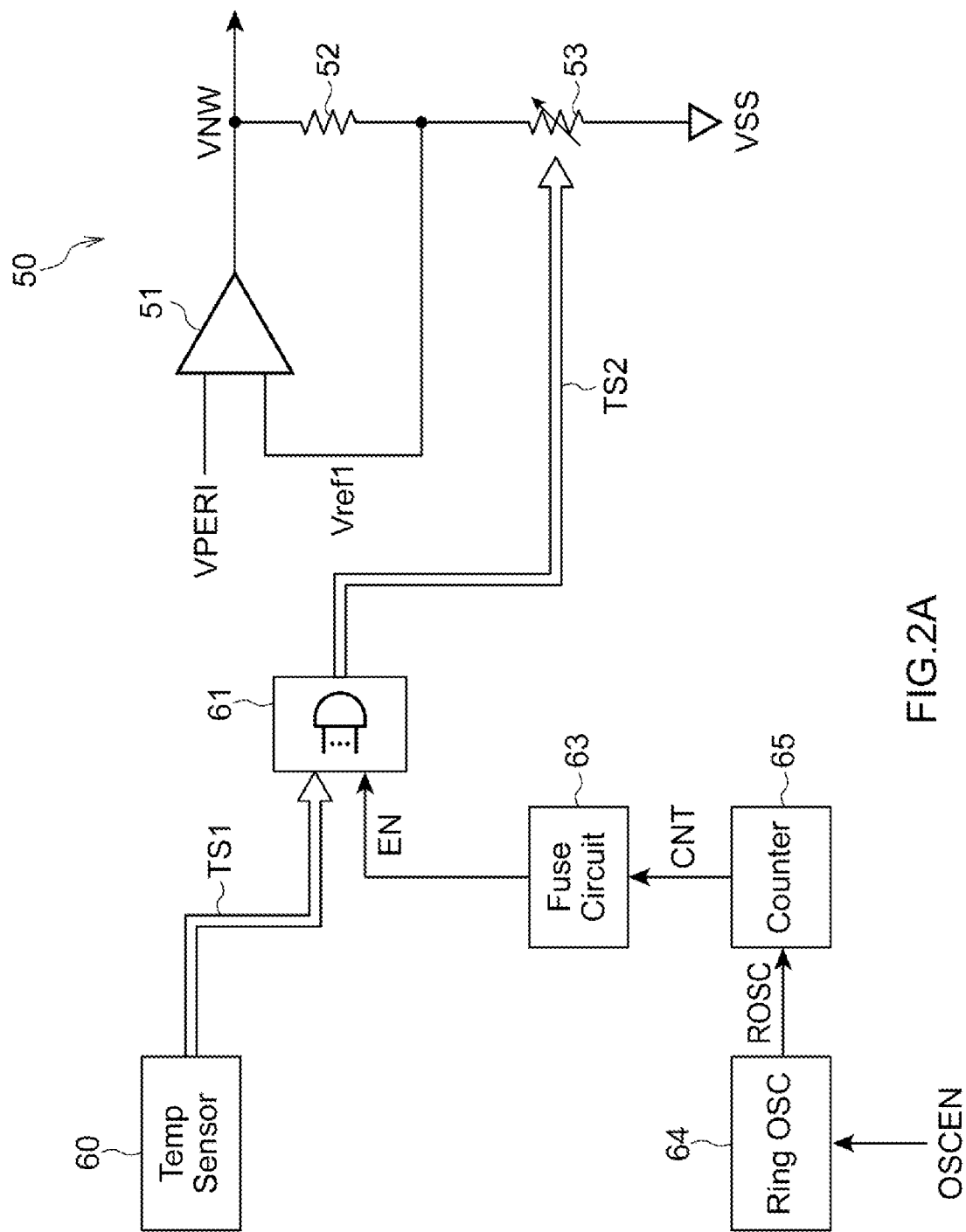
FIG. 2A and FIG. 2B are circuit diagrams of a power supply circuit that generates a well potential and a circuit that controls the power supply circuit.

FIG. 2A is a circuit diagram of the power supply circuit 50 that generates the well potential VNW and a circuit that controls the power supply circuit 50. As shown in FIG. 2A, the power supply circuit 50 includes a comparator 51 that compares a power potential VPERI with a reference potential Vref1 and outputs the well potential VNW on the basis of a result of the comparison, and resistors 52 and 53 that generate the reference potential Vref1. The resistors 52 and 53 are coupled in series between the n-well regions 8 and a power supply line supplied with the ground potential VSS. The potential of a coupling point between the resistor 52 and the resistor 53 is used as the reference potential Vref1. The resistance value of the resistor 52 may be adjustable in a trimming process that is performed during manufacturing. The resistor 53 is a variable resistor with a resistance value adjustable based on a control code TS2.

Figure 3A:
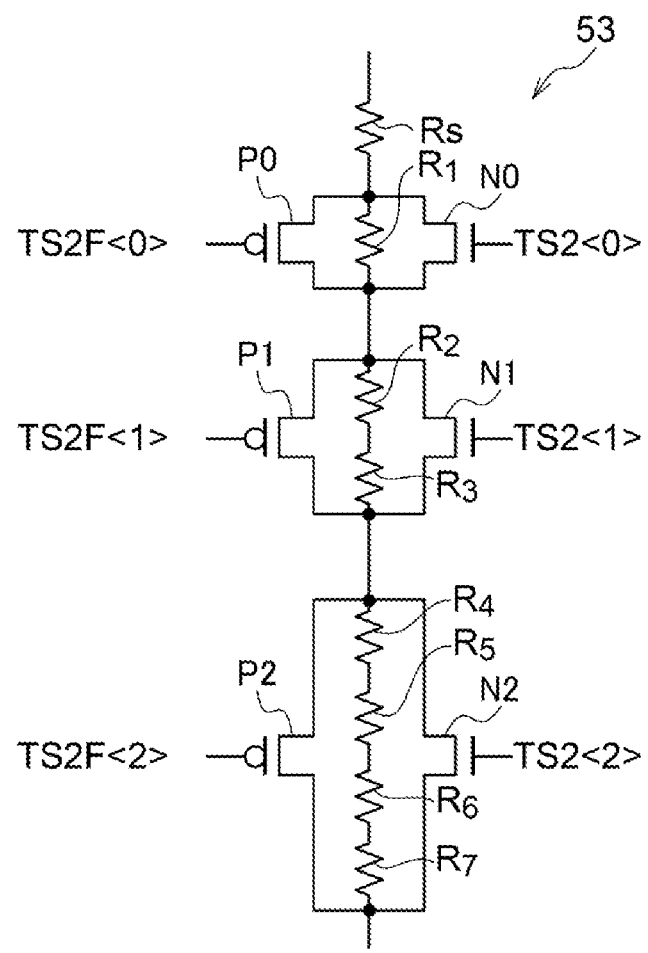
FIG. 3A is a circuit diagram of a variable resistor.

FIG. 3A is a circuit diagram of the resistor 53. In the example shown in FIG. 3A, the control code TS2 is a 3-bit binary signal and the resistor 53 includes resistors $R_1$ to $R_7$ and Rs coupled in series, transistors N0 and P0 that bypass the resistor $R_1$, transistors N1 and P1 that bypass the two resistors $R_2$ and $R_3$, and transistors N2 and P2 that bypass the four resistors $R_4$ to $R_7$. The resistance values of the resistors $R_1$ to $R_7$ are the same value (=R). A bit TS2<0> of the control code TS2 and an inverted signal TS2F<0> thereof are supplied to gate electrodes of the transistors N0 and P0, respectively. A bit TS2<1> of the control code TS2 and an inverted signal TS2F<1> thereof are supplied to gate electrodes of the transistors N1 and P1, respectively. A bit TS2<2> of the control code TS2 and an inverted signal TS2F<2> thereof are supplied to gate electrodes of the transistors N2 and P2, respectively. Accordingly, the resistance value of the resistor 53 can be set to eight levels responsive to the control code TS2. The relationship between the control code TS2 and the resistance value is as shown in FIG. 3B and the resistance value of the resistor 53 can be set to eight levels responsive to changes of the control code TS2 according to the ambient temperature.

Figure 4:
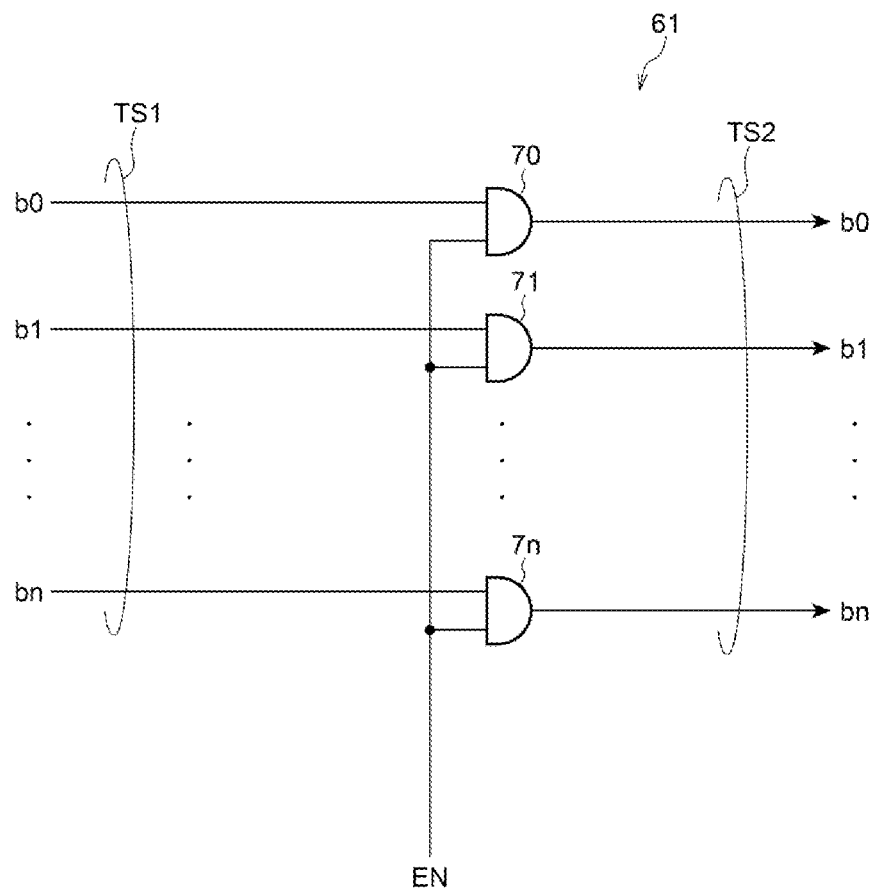
FIG. 4 is a circuit diagram of a control circuit.

The circuit that controls the power supply circuit 50 includes a temperature sensor 60. The temperature sensor 60 generates a control code TS1 according to the ambient temperature. The control code TS1 is supplied to a control circuit 61. The control circuit 61 outputs the value of the control code TS1 as it is as the control code TS2 when an enable signal EN is in an active state. On the other hand, the control circuit 61 fixes the value of the control code TS2 to a predetermined value regardless of the value of the control code TS1 when the enable signal EN is in an inactive state. FIG. 4 is an example of a circuit diagram of the control circuit 61. In the example shown in FIG. 4, the control code TS1 has an (n+1)-bit configuration composed of bits b0 to bn. The control circuit 61 includes AND gate circuits 70 to 7n respectively corresponding to these bits. The associated bits b0 to bn are supplied to ones of input nodes of the AND gates circuits 70 to 7n, respectively, and the enable signal EN is supplied in common to the others of the input nodes of the AND gate circuits 70 to 7n. Accordingly, when the enable signal EN is active at a high level, the values of the bits b0 to bn constituting the control code TS1 are output as they are as the values of the bits b0 to bn constituting the control code TS2. In contrast thereto, when the enable signal EN is inactive at a low level, the bits b0 to bn constituting the control code TS2 are all at a low level. Therefore, when the control code TS2 has a 3-bit configuration as shown in FIG. 3A, the transistors N0 to N2 and P0 to P2 are all turned off and accordingly the resistance value of the resistor 53 is Rs+7R which is the largest value.

The enable signal EN is retained in a fuse circuit 63. The fuse circuit 63 is a memory circuit that stores the enable signal EN in a non-volatile manner. The circuit that controls the power supply circuit 50 further includes a ring oscillator circuit 64 and a counter 65. The ring oscillator circuit 64 generates an oscillator signal ROSC when an enable signal OSCEN is active. The frequency of the oscillator signal ROSC is primarily decided by a threshold voltage of a transistor constituting the ring oscillator circuit 64. The frequency of the oscillator signal ROSC is high when the threshold voltage of the transistor constituting the relevant semiconductor device is low, and the frequency of the oscillator signal ROSC is low when the threshold voltage of the transistor constituting the relevant semiconductor device is high. That is, the ring oscillator circuit 64 constitutes a test circuit for measuring a switching speed of the transistor constituting the relevant semiconductor device. The counter 65 constitutes a measurement circuit that measures an operation speed of the ring oscillator circuit 64 by counting active edges of the oscillator signal ROSC. Subsequently, when a count value CNT of the counter 65 reaches a predetermined value, the enable signal EN at a high level is written to the fuse circuit 63.

Figure 5A:
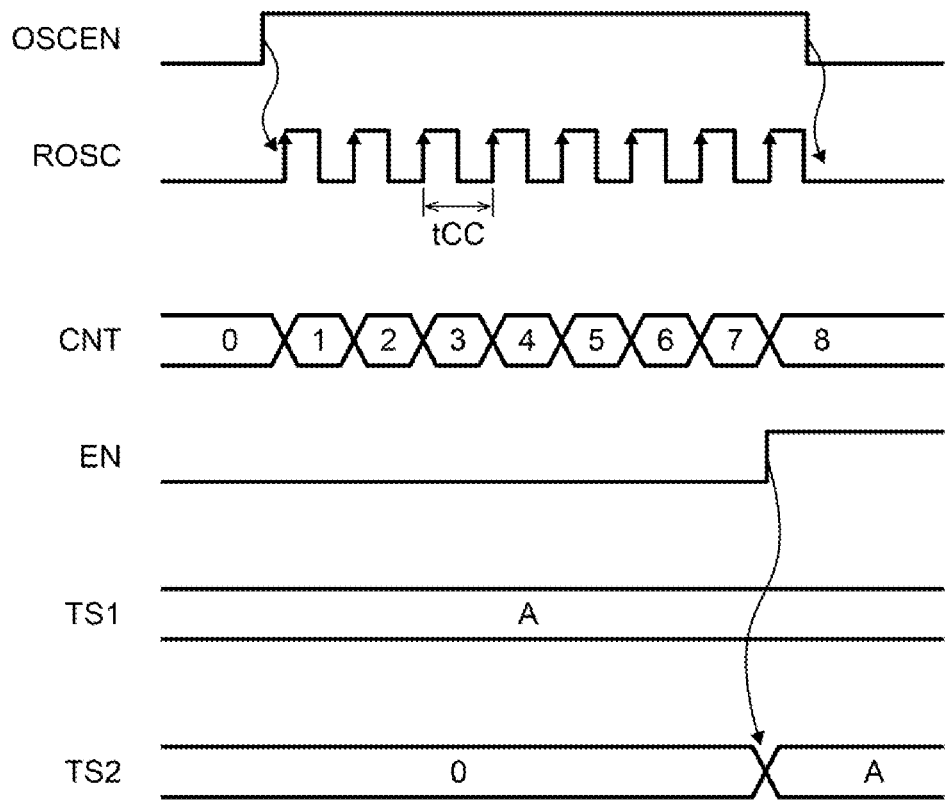
FIG. 5A and FIG. 5B are timing charts for explaining examples of an operation generating an enable signal.
Figure 5B:
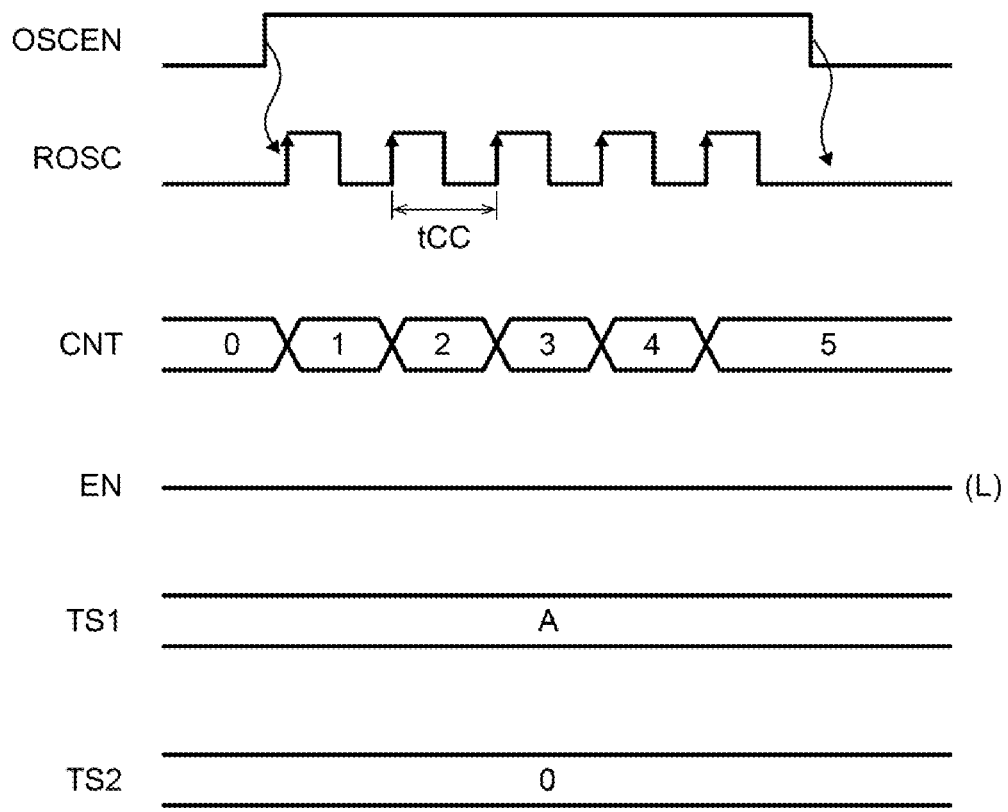

FIGS. 5A and 5B are timing charts explaining examples of an operation for generating the enable signal EN. In the examples shown in FIGS. 5A and 5B, the enable signal EN is set to a high level when the count value CNT of the counter 65 reaches 8. Since an oscillation period tCC of the oscillator signal ROSC is relatively short in the example shown in FIG. 5A, the count value CNT of the counter 65 reaches 8 during a predetermined period in which the enable signal OSCEN is active. In response thereto, the enable signal EN is set to a high level. In this case, the value of the control code TS2 matches the value of the control code TS1. That is, when the value of the control code TS1 is A, the value of the control code TS2 also becomes A. Accordingly, the level of the well potential VNW can be optimized according to the ambient temperature and the off leakage current can be reduced. In contrast thereto, since the oscillation period tCC of the oscillator signal ROSC is relatively long in the example shown in FIG. 5B, the count value CNT of the counter 65 does not reach 8 during a predetermined period in which the enable signal OSCEN is active. Accordingly, the enable signal EN is set to a low level. In this case, the value of the control code TS2 is fixed to zero (the lowest value) and the adjustment operation for the well potential VNW according to the ambient temperature is disabled. The long oscillation period tCC of the oscillator signal ROSC indicates that the threshold voltage of the transistor constituting the relevant semiconductor device is high. That is, in the present embodiment, the adjustment operation for the well potential VNW according to the ambient temperature is disabled when the threshold voltage of the transistor is high. This can prevent further reduction of the switching speed resulting from adjustment of the well potential VNW according to the ambient temperature.

Writing of the enable signal EN to the fuse circuit 63 can be performed at the manufacturing stage. In this case, the ring oscillator circuit 64 and the counter 65 are not used in practical use. Alternatively, a latch circuit may be used instead of the fuse circuit 63 and a speed evaluation using the ring oscillator circuit 64 and the counter 65 may be performed at the time of initialization after power-on, to write the enable signal EN indicating a result of the speed evaluation to the latch circuit.

Figure 2B:
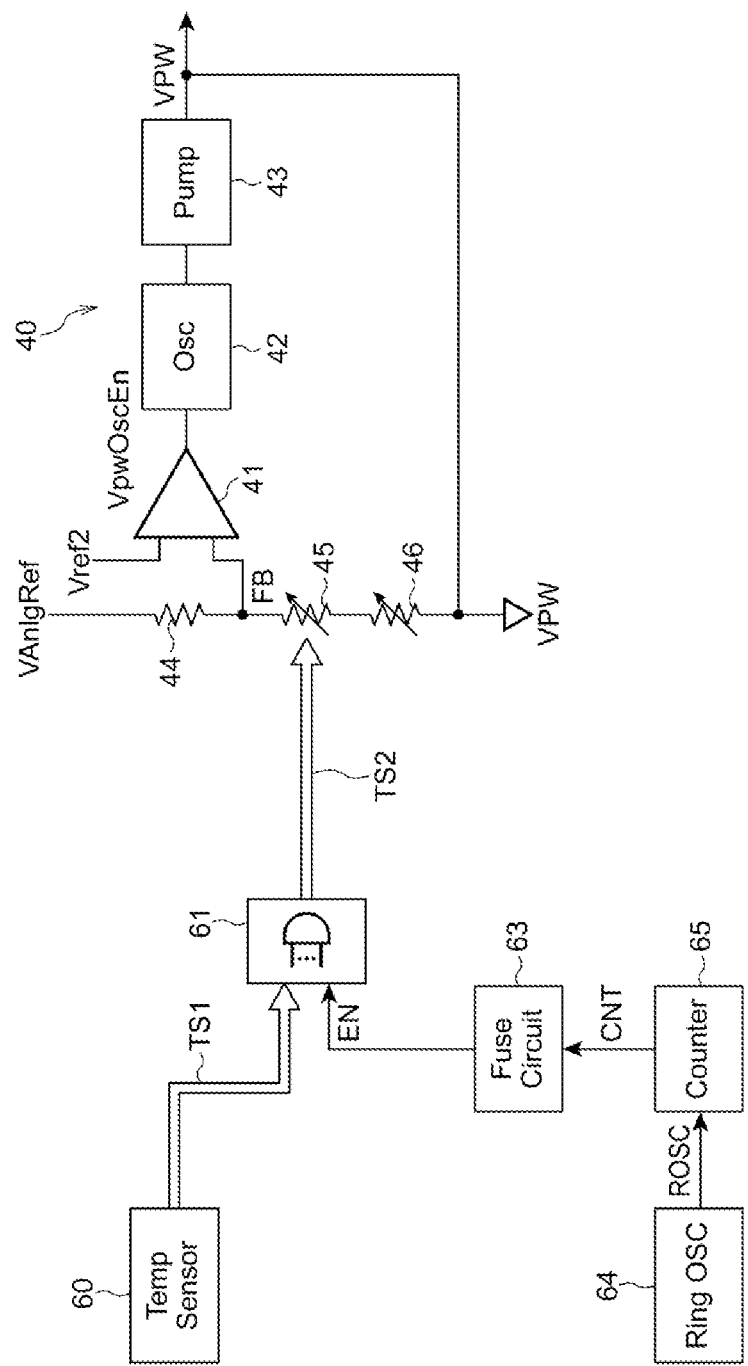

FIG. 2B is a circuit diagram of the power supply circuit 40 that generates the well potential VPW and a circuit that controls the power supply circuit 40. As shown in FIG. 2B, the power supply circuit 40 includes a comparator 41 that compares a reference potential Vref2 with a feedback potential FB and generates an enable signal VpwOscEn on the basis of a result of the comparison, an oscillator circuit 42 that performs an oscillation operation responsive to the enable signal VpwOscEn, a charge pump circuit 43 that performs a pumping operation according to an output of the oscillator circuit 42, and resistors 44 to 46 that generate the feedback potential FB. The resistors 44 to 46 are coupled in series between a line supplied with a reference potential VAnlgRef and the p-well regions 6. The potential of a coupling point between the resistor 44 and the resistor 45 is used as the feedback potential FB. The resistance value of the resistor 46 may be adjustable in the trimming operation that is performed during manufacturing. The resistor 45 is a variable resistor with a resistance value adjustable based on the control code TS2. A circuit that generates the control code TS2 has the same configuration as that in FIG. 2A. That is, when the enable signal EN retained in the fuse circuit 63 is active at a high level, the control code TS2 supplied to a decoder 62 (not shown) matches the control code TS1 output from the temperature sensor 60. Therefore, the level of the well potential VPW is adjusted according to the ambient temperature. In contrast thereto, when the enable signal EN retained in the fuse circuit 63 is inactive at a low level, the control code TS2 is fixed and therefore the level of the well potential VPW is fixed to a predetermined level regardless of the ambient temperature.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combinations or subcombinations of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:
1. An apparatus comprising:
a MOS transistor arranged in a well region supplied with a well potential;
a temperature sensor configured to generate a control code indicating an ambient temperature; and
a voltage generator configured to perform a first control operation controlling a level of the well potential responsive to the control code in a first condition and perform a second control operation controlling a level of the well potential regardless of the control code in a second condition.

2. The apparatus of claim 1, further comprising a memory circuit configured to store information indicating one of the first and second conditions.

3. The apparatus of claim 2, wherein the memory circuit is configured to store the information in a non-volatile manner.

4. The apparatus of claim 2, further comprising a test circuit and a measurement circuit configured to measure an operation speed of the test circuit,
wherein the measurement circuit is configured to write the information to the memory circuit responsive to a measurement result of the operation speed.

5. The apparatus of claim 4,
wherein the test circuit includes a ring oscillator circuit configured to generate an oscillation signal,
wherein the measurement circuit includes a counter circuit configured to count the oscillation signal during a predetermined period, and
wherein the measurement circuit is configured to write the information indicating the first condition to the memory circuit when a count value of the counter circuit reaches a predetermined value.

6. The apparatus of claim 5, wherein the measurement circuit is configured to write the information indicating the second condition to the memory circuit when the count value of the counter circuit does not reach the predetermined value.

7. The apparatus of claim 1,
wherein the voltage generator includes a comparator circuit configured to compare a first potential generated based on the well potential with a second potential generated independently from the first potential, and
wherein the voltage generator is configured to control a level of the well potential by controlling the first potential.

8. The apparatus of claim 7,
wherein the voltage generator further includes first and second resistors coupled in series between the well region and a reference line supplied with a fixed potential, and
wherein the voltage generator is configured to control a level of the well potential by controlling a resistance value of the second resistor responsive to the control code.

9. The apparatus of claim 8, wherein a resistance value of the first resistor is adjustable by a trimming operation.

10. An apparatus comprising:
a temperature sensor configured to generate a first control code indicating an ambient temperature;
a memory circuit configured to store an enable signal;
a control circuit configured to generate a second control code responsive to the first control code and the enable signal; and
a voltage generator configured to generate a power potential and control a level of the power potential responsive to the second control code,
wherein the control circuit is configured to match a value of the second control code with a value of the first control code when the enable signal is in an active state and fix the second control code to a predetermined value when the enable signal is in an inactive state.

11. The apparatus of claim 10, further comprising a ring oscillator circuit configured to generate an oscillation signal,
wherein a state of the enable signal is decided by a frequency of the oscillation signal.

12. The apparatus of claim 11, wherein the enable signal is brought into the active state when the frequency of the oscillation signal exceeds a predetermined value.

13. The apparatus of claim 10, wherein the memory circuit is configured to store the enable signal in a non-volatile manner.

14. The apparatus of claim 10, further comprising a MOS transistor arranged in a well region supplied with the power potential.

15. An apparatus comprising:
a transistor arranged in a well region supplied with a well potential;
a first sensor circuit configured to generate a first code responsive to a first sensing result;
a second sensor circuit configured to generate a control signal responsive to a second sensing result;
a control circuit configured to generate a second code responsive to the first code and the control signal; and
a voltage generator configured to generate the well potential and control a level of the well potential responsive to the second code.

16. The apparatus of claim 15, wherein the first sensor circuit is configured to sense an ambient temperature to generate the first code.

17. The apparatus of claim 16, wherein the second sensor circuit is configured to sense an operation speed of a test circuit to generate the control signal.

18. The apparatus of claim 17, wherein the control circuit is configured to match a value of the second code with a value of the first code when the control signal is in a first state.

19. The apparatus of claim 18, wherein the control circuit is configured to fix the second code to a predetermined value when the control signal is in a second state.

20. The apparatus of claim 19, further comprising a memory circuit configured to store the control signal in a non-volatile manner.

* * * * *